United States Patent
Kim (10) Patent No.: US 9,455,420 B2
(45) Date of Patent: Sep. 27, 2016

(54) ORGANIC LIGHT-EMITTING DEVICE AND METHOD OF MANUFACTURING THE SAME

(71) Applicant: Samsung Display Co., Ltd., Yongin, Gyeonggi-do (KR)

(72) Inventor: Jeong-Hun Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 224 days.

(21) Appl. No.: 14/074,625

(22) Filed: Nov. 7, 2013

(65) Prior Publication Data
US 2015/0001480 A1    Jan. 1, 2015

(30) Foreign Application Priority Data
Jul. 1, 2013  (KR) .................. 10-2013-0076559

(51) Int. Cl.
*H01L 21/00* (2006.01)
*H01L 51/52* (2006.01)
*H01L 51/00* (2006.01)

(52) U.S. Cl.
CPC ....... *H01L 51/5265* (2013.01); *H01L 51/0013* (2013.01)

(58) Field of Classification Search
CPC ............... H01L 51/5265; H01L 51/0013
See application file for complete search history.

(56) References Cited

U.S. PATENT DOCUMENTS

| | | | |
|---|---|---|---|
| 2010/0055343 A1 | 3/2010 | Lee et al. | |
| 2011/0240965 A1 | 10/2011 | Yoon et al. | |
| 2013/0001526 A1 | 1/2013 | Kwak et al. | |
| 2013/0105778 A1* | 5/2013 | Kim | H01L 27/3213 257/40 |

FOREIGN PATENT DOCUMENTS

| | | |
|---|---|---|
| KR | 10-2004-0104225 A | 12/2004 |
| KR | 10-2010-0024672 A | 3/2010 |
| KR | 10-2011-0110589 A | 10/2011 |
| KR | 10-2013-0007279 A | 1/2013 |

* cited by examiner

*Primary Examiner* — Laura Menz
(74) *Attorney, Agent, or Firm* — Lewis Roca Rothgerber Christie LLP (57) ABSTRACT

According to embodiments of the present invention, a full-color organic light-emitting device has high reliability. The organic light-emitting device is manufactured using a simple and inexpensive manufacturing process.

4 Claims, 2 Drawing Sheets

FIG. 1

ORGANIC LIGHT-EMITTING DEVICE AND METHOD OF MANUFACTURING THE SAME

CROSS-REFERENCE TO RELATED APPLICATION

This application claims priority to and the benefit of Korean Patent Application No. 10-2013-0076559, filed on Jul. 1, 2013, in the Korean Intellectual Property Office, the content of which is incorporated herein in its entirety by reference.

BACKGROUND

1. Field

One or more embodiments of the present invention relate to a full-color organic light-emitting device having high reliability, and a simple and inexpensive manufacturing process for manufacturing the same.

2. Description of the Related Art

Organic light-emitting devices (OLEDs), which are self-emitting devices, have advantages such as wide viewing angles, excellent contrast, quick response, high brightness, excellent driving voltage characteristics, and capable of providing full color images.

An OLED has a structure including a substrate; and an anode, a hole transport layer, an emission layer, an electron transport layer, and a cathode, which are sequentially stacked on the substrate. The hole transport layer, the emission layer, and the electron transport layer are organic thin films formed of organic compounds.

An operating principle of an organic light-emitting device having such a structure is described below.

When a voltage is applied between the anode and the cathode, holes injected from the anode pass through the hole transport layer and migrate toward the emission layer, and electrons injected from the cathode pass through the electron transport layer and migrate toward the emission layer. The holes and electrons, which are charge carriers, are recombined in the emission layer to generate excitons. When the excitons are transitioned from an excited state to a ground state, light is generated.

SUMMARY

Aspects of one or more embodiments of the present invention are directed toward an organic light-emitting device having high reliability, and a simple and inexpensive manufacturing process for manufacturing the same.

Additional aspects will be set forth in part in the description which follows and, in part, will be apparent from the description, or may be learned by practice of the presented embodiments.

According to one or more embodiments of the present invention, an organic light-emitting device includes: a substrate with a first sub-pixel, a second sub-pixel, and a third sub-pixel; a first electrode in each of the first sub-pixel, the second sub-pixel, and the third sub-pixel; a second electrode facing the first electrode; and an emission layer between the first electrode and the second electrode; wherein the emission layer includes a first emission layer in the first sub-pixel and configured to emit a first color light, a second emission layer in the second sub-pixel and configured to emit a second color light, and a third emission layer in all of the first sub-pixel, the second sub-pixel, and the third sub-pixel and configured to emit a third color light, the third emission layer has a first region located in the first sub-pixel, a second region located in the second sub-pixel, and a third region located in the third sub-pixel, and i) the first region of the third emission layer is between the first emission layer and the first electrode, and the second region of the third emission layer is between the second emission layer and the second electrode, or ii) the first region of the third emission layer is between the first emission layer and the second electrode, and the second region of the third emission layer is between the second emission layer and the first electrode. The organic light-emitting device may further include a hole transport region between the first electrode and the emission layer which includes at least one selected from a hole injection layer, a hole transport layer, a single layer having a hole injection capability and a hole transport capability, and an electron blocking layer; and an electron transport region between the emission layer and the second electrode which includes at least one selected from a hole blocking layer, an electron transport layer, and an electron injection layer.

According to one or more embodiments of the present invention, a method of manufacturing an organic light-emitting device includes: forming a first electrode in each of a first sub-pixel region, a second sub-pixel region, and a third sub-pixel region on a substrate having the first sub-pixel region, the second sub-pixel region, and the third sub-pixel region; forming a second emission layer for emitting a second color light in the second sub-pixel region; forming a third emission layer for emitting a third color light in all of the first sub-pixel region, the second sub-pixel region, and the third sub-pixel region; forming a first emission layer for emitting the first color light in the first sub-pixel region; and forming a second electrode, wherein the first color light is red, the second color light is green, and the third color light is blue.

According to one or more embodiments of the present invention, a method of manufacturing an organic light-emitting device includes: forming a first electrode in each of a first sub-pixel region, a second sub-pixel region, and a third sub-pixel region on a substrate having the first sub-pixel region, the second sub-pixel region, and the third sub-pixel region; forming a first emission layer for emitting a first color light in the first sub-pixel; forming a third emission layer for emitting a third color light in all of the first sub-pixel region, the second sub-pixel region, and the third sub-pixel region; forming a second emission layer for emitting a second color light in the second sub-pixel region; and forming a second electrode, wherein the first color light is red, the second color light is green, and the third color light is blue.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated items listed. Expressions such as "at least one of," when preceding a list of elements, modify the entire list of elements and do not modify the individual elements of the list. It will be understood that when an element or layer is referred to as being "on," or "connected to" another element or layer, it can be directly on or connected to the other element or layer or intervening elements or layers may be present. When an element is referred to as being "directly on" or "directly connected to" another element or layer, there is no intervening elements or layers present. Further, the use of "may" when describing embodiments of the present invention refers to "one or more embodiments of the present invention."

The term "common layer" used herein refers to a layer that is formed in all of the first, second and third (e.g., red, green and blue) sub-pixels (i.e., as a continuous layer) instead of being separately patterned according to the first, second and third (e.g., red, green, and blue) sub-pixels.

Each of a first color light, a second color light, and a third color light may be selected from red light, green light, and blue light. However, the first color light, the second color light, and the third color light are not limited thereto as long as a mixed light of the first color light, the second color light, and the third color light is white light. For example, according to an embodiment of the present invention, the first color light is red light, the second color light is green light, and the third color light is blue light, but the first color light, the second color light, and the third color light are not limited thereto. Accordingly, an organic light-emitting device enables full-color emission.

Figure 1:
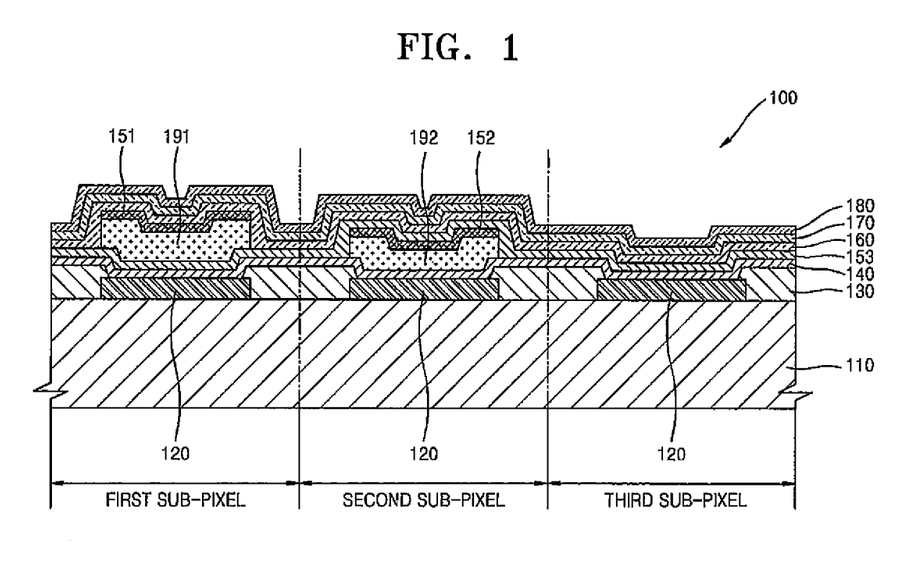
FIG. 1 is a schematic view of the structure of an organic light-emitting device according to an embodiment of the present invention.

FIG. 1 is a schematic cross-sectional view of an organic light-emitting device 100 according to an embodiment of the present invention. Hereinafter, the structure of an organic light-emitting device according to an embodiment of the present invention and a method of manufacturing an organic light-emitting device according to an embodiment of the present invention will be described in connection with FIG. 1.

The organic light-emitting device 100 of FIG. 1 includes a substrate 110 with a first sub-pixel, a second sub-pixel, and a third sub-pixel. A first electrode 120 is patterned (e.g., separated from one another) in each of the first sub-pixel, the second sub-pixel, and the third sub-pixel. A hole injection layer 140 is formed as a common layer on the first electrodes 120 in all of the first sub-pixel, the second sub-pixel, and the third sub-pixel. An emission layer is formed on the hole injection layer 140.

The emission layer includes a first emission layer 151 that is formed in the first sub-pixel and emits a first color light, a second emission layer 152 that is formed in the second sub-pixel and emits a second color light, and a third emission layer 153 that is formed as a common layer in all of the first sub-pixel, the second sub-pixel, and the third sub-pixel and emits a third color light. The third emission layer 153 has a first region located in the first sub-pixel, a second region located in the second sub-pixel, and a third region located in the third sub-pixel. The first region of the third emission layer 153 is disposed between the first emission layer 151 and the first electrode 120, and the second region of the third emission layer 153 is disposed between the second emission layer 152 and a second electrode 180. Also, a first auxiliary layer 191 is disposed between the first emission layer 151 and the third emission layer 153, and a second auxiliary layer 192 is disposed between the first electrode 120 and the second emission layer 152. The first color light may be red light, the second color light may be green light, and the third color light may be blue light.

An electron transport layer 160, an electron injection layer 170, and a second electrode 180 are each sequentially disposed in this stated order on the resultant structure, as a common layer in all of the first sub-pixel, the second sub-pixel, and the third sub-pixel.

For use as the substrate 110, any suitable substrate that is used in general organic light-emitting devices may be used, and the substrate 110 may be a glass substrate or a transparent plastic substrate, each with excellent mechanical strength, thermal stability, transparency, surface smoothness, ease of handling, and water repellency. Moreover, the substrate 110 may instead be formed of an non-transparent material, such as silicon or stainless steel.

The first electrode 120 is formed on the substrate 110 in each of the first sub-pixel, the second sub-pixel, and the third sub-pixel. The first electrode 120 may be formed by, for example, depositing or sputtering a material suitable for a first electrode on the substrate 110. When the first electrode 120 is an anode, to allow holes to be easily provided to the first emission layer 151, the second emission layer 152, and the third emission layer 150, the material for the first electrode 120 may be selected from materials having a high work capability. The first electrode 120 may be a reflective electrode or a transmissive electrode.

The first electrode 120 may be, for example, formed by using a transparent and highly conductive material, such as indium tin oxide (ITO), indium zinc oxide (IZO), tin oxide ($SnO_2$), zinc oxide (ZnO), Al-doped zinc oxide (AZO), or indium oxide ($In_2O_3$). According to an embodiment of the present invention, when magnesium (Mg), aluminum (Al), aluminum-lithium (Al—Li), calcium (Ca), magnesium-indium (Mg—In), or magnesium-silver (Mg—Ag) is used, the first electrode 120 may be formed as a reflective electrode.

The first electrode 120 may have a single-layer structure, or a multi-layer structure including two or more layers. For example, the first electrode 120 may have a three-layered structure of ITO/Ag/ITO, but the structure of the first electrode 120 is not limited thereto.

A pixel insulating layer 130 is formed along edges of the first electrodes 120. The pixel insulating layer 130 defines a pixel region, and may include various suitable organic insulating materials, inorganic insulating materials, or organic/inorganic composite insulating materials, such as a silicon-based material.

The hole injection layer 140 is formed as a common layer on the first electrodes 120. The hole injection layer 140 may contact the first electrodes 120.

The hole injection layer 140 may be formed on the first electrodes 120 by using various suitable methods, such as vacuum deposition, spin coating, casting, Langmuir-Blodgett deposition (LB), ink-jet printing, laser printing, or laser-thermal transferring.

When the hole injection layer 140 is formed by vacuum deposition, vacuum deposition conditions may vary according to the compound that is used to form the hole injection layer 140, and the desired structure and thermal properties of the hole injection layer 140 to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the hole injection layer 140 is formed by spin coating, the coating conditions may vary according to the compound that is used to form the hole injection layer 140, and the desired structure and thermal properties of the hole injection layer 140 to be formed. For example, the coating rate may be in the range of about 2000 rpm to about 5000 rpm, and a temperature at which heat treatment is performed to remove a solvent after coating may be in the range of about 80° C. to about 200° C. However, the coating conditions are not limited thereto.

As a material for the hole injection layer 140, any suitable hole injection materials may be used. Examples of suitable materials for the hole injection layer 140 include N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4''-tris(3-methylphenyl-phenylamino)triphenylamine (m-MTDATA), (N,N'-diphenyl-amino)triphenylamine (TDATA), (2-naphthylphenylamino)triphenylamine (2-TNATA), polyaniline/Dodecylbenzenesulfonic acid (Pani/DBSA), poly(3,4-ethylenedioxythiophene/poly(4-styrenesulfonate) (PEDOT/PSS), polyaniline/camphor sulfonic acid (pani/CSA), and polyaniline/poly(4-styrenesulfonate) (PANI/PSS), but are not limited thereto.

m-MTDATA

TDATA

2-TNATA

A thickness of the hole injection layer 140 may be in a range of about 100 Å to about 10,000 Å (for example, about 100 Å to about 1,500 Å). In one embodiment, when the thickness of the hole injection layer 140 is within the range described above, the hole injection layer 140 has satisfactory hole injection ability without a substantial increase in driving voltage.

The hole injection layer 140 may further include, in addition to the hole injection materials, a charge-generation material to improve conductivity of the hole injection layer 140. Non-limiting examples of the charge generation material include a quinone derivative, such as tetracyanoquinonedimethane (TCNQ) or 2,3,5,6-tetrafluoro-tetracyano-1,4-benzoquinonedimethane (F4TCNQ); a metal oxide, such as tungsten oxide or molybdenum oxide; and a cyano group-containing compound, such as Compound 100 below, but are not limited thereto.

Compound 100

When the hole injection layer 140 further includes a charge-generation material, the charge-generating material may be homogeneously dispersed or non-homogeneously distributed in the hole injection layer 140.

Then, a hole transport layer may be formed on the hole injection layer 140 by using various suitable methods, such as vacuum deposition, spin coating, casting, or LB. The hole transport layer may be located between the hole injection layer 140 and the emission layer. When the hole transport layer is formed using vacuum deposition or spin coating, the deposition and coating conditions may be similar to those for the formation of the hole injection layer 140, though the deposition and coating conditions may vary according to a compound that is used to form the hole transport layer.

Examples of a known suitable hole transport material include a carbazole derivative, such as N-phenylcarbazole or polyvinylcarbazol, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine (NPB), but are not limited thereto.

TPD

NPB

A thickness of the hole transport layer may be in a range of about 50 Å to about 2,000 Å, for example, about 100 Å to about 1,500 Å. In one embodiment, when the thickness of the hole transport layer is within these ranges, the hole transport layer has satisfactory hole transporting ability without a substantial increase in driving voltage.

The hole transport layer may further include, in addition to the hole transport materials, a charge-generation material to improve conductivity of the hole transport layer. The charge-generation material may be the same as described above.

When the hole transport layer further includes a charge-generation material, the charge-generating material may be homogeneously dispersed or non-homogeneously distributed in the hole transport layer.

The second auxiliary layer 192 and the second emission layer 152 may be formed on the hole injection layer 140 in the second sub-pixel. The second color light, for example, green light may be emitted from the second emission layer 152. The second auxiliary layer 192 may promote the movement of holes from the first electrode 110. Also, the second auxiliary layer 192 may provide enough of a resonance distance to improve the external luminescent efficiency of the second color light emitted from the second emission layer 152 according to a constructive interference principal.

The second auxiliary layer 192 may include at least one of suitable hole injection materials and suitable hole transport materials. Also, the second auxiliary layer 192 may further include, in addition to suitable hole injection materials and/or hole transport materials, suitable charge-generation materials, for example, TCNQ. When the second auxiliary layer 192 further includes a charge-generation material, the charge-generating material may be homogeneously dispersed or non-homogeneously distributed in the second auxiliary layer 192.

The second auxiliary layer 192 may have a single-layer structure or a multi-layer structure including two or more layers. When the second auxiliary layer 192 has a multi-layer structure including two or more layers, materials included in the different layers of the multi-layer structure may be different from or identical to each other. The second auxiliary layer 192 and the second emission layer 152 may be formed by using various methods, such as vacuum deposition, spin coating, casting, LB, ink-jet printing, laser printing, or thermal transferring. For example, the second auxiliary layer 192 and the second emission layer 152 may be concurrently (e.g., simultaneously) formed by thermal transferring.

The third emission layer 153 may be formed as a common layer on the first electrode 120. The third emission layer 153 may be formed on the first electrodes 120 by using various methods, such as deposition, spin coating, casting, LB, ink-jet printing, laser printing, or laser-thermal transferring. For example, the third emission layer 153 may be formed by deposition. When the third emission layer 153 is formed by deposition, since the third emission layer 153 is formed as a common layer of the organic light-emitting device 100, an open mask method may be used.

In the first sub-pixel, the first auxiliary layer 191 and the first emission layer 151 are formed on the third emission layer 153. The first color light (for example, red light) may be emitted from the first emission layer 151. The first auxiliary layer 191 may promote the movement of holes from the first electrodes 120. Also, the first auxiliary layer 191 may provide a resonance distance to improve the external luminescent efficiency of the first color light emitted from the first emission layer 151 according to a constructive interference principal.

The first auxiliary layer 191 may include at least one of suitable hole injection materials and suitable hole transport materials. Also, the first auxiliary layer 191 may further include, in addition to suitable hole injection materials and/or hole transport materials, suitable charge-generation materials, for example, TCNQ. When the first auxiliary layer 191 further includes a charge-generation material, the charge-generating material may be homogeneously dispersed or non-homogeneously distributed in the first auxiliary layer 191.

The first auxiliary layer 191 may have a single-layer structure or a multi-layer structure including two or more layers. When the first auxiliary layer 191 has a multi-layer structure including two or more layers, materials included in the different layers of the multi-layer structure may be different from or identical to each other. The first auxiliary layer 191 and the first emission layer 151 may be formed on the third emission layer 153 by using various methods, such as vacuum deposition, spin coating, casting, LB, ink-jet printing, laser printing, or thermal transferring. For example, the first auxiliary layer 191 and the first emission layer 151 may be concurrently (e.g., simultaneously) formed by thermal transferring.

That is, in the organic light-emitting device 100 of FIG. 1, the second emission layer 152 in the second sub-pixel is located under the third emission layer 153 that is a common layer, and the first emission layer 151 in the first sub-pixel is located above the third emission layer 153 that is a common layer. To do this, the second emission layer 152 is formed in the second sub-pixel, and then, the third emission layer 153 that is a common layer is formed, and then, the first emission layer 151 is formed in the first sub-pixel. In this regard, the second auxiliary layer 192 and the second emission layer 152 may be concurrently (e.g., simultaneously) formed by thermal transferring, and the first auxiliary layer 191 and the first emission layer 151 may be concurrently (e.g., simultaneously) formed by thermal transferring. By doing so, the second emission layer 152 and the first emission layer 151 may be finely patterned.

For example, in the case of an envisioned organic light-emitting device A in which a first emission layer of a first sub-pixel and a second emission layer of a second sub-pixel are formed by thermal transferring, and then, a third emission layer is formed as a common layer, both of the first emission layer and the second emission layer of the organic light-emitting device A are located under the third emission layer (that is, between a first electrode and the third emission layer). In the case of another envisioned organic light-emitting device B in which a third emission layer is formed as a common layer and then, a first emission layer of a first sub-pixel and a second emission layer of a second sub-pixel are formed by thermal transferring, both of the first emission layer and the second emission layer of the organic light-emitting device B are located above the third emission layer (that is, between a second electrode and the third emission layer). Regarding the envisioned organic light-emitting devices A and B, the first emission layer of the first sub-pixel and the second emission layer of the second sub-pixel are consecutively formed. Accordingly, an edge of the first emission layer and an edge of the second emission layer may overlap. Due to the overlapping, the envisioned organic light-emitting devices A and B may have defects.

For example, regarding the envisioned organic light-emitting device A, when the first emission layer of the first sub-pixel is formed by thermal transferring, and then, the second emission layer of the second sub-pixel is formed by thermal transferring, an edge of the first emission layer and the second emission layer may overlap. When the second emission layer of the envisioned organic light-emitting device A is formed by thermal transferring, a peeling process in which a donor film is removed from a region for the second emission layer is necessarily required. During the peeling process, in the envisioned organic light-emitting device A, the edge of the first emission layer overlapping the second emission layer may be detached from the underlying structure of the first emission layer. This may lead to defects of the envisioned organic light-emitting device A during driving.

However, as illustrated in FIG. 1, when the second auxiliary layer 192 and the second emission layer 152 are formed by thermal transferring, and then the third emission layer 153 is formed as a common layer by deposition using an open mask, and then, the first auxiliary layer 191 and the first emission layer 151 are formed by thermal transferring, the edge of the first emission layer 151 and the edge of the second emission layer 152, each formed by thermal transferring, do not overlap. That is, the first emission layer 151 and the second emission layer 152 may be spaced apart from each other in such a way that the first emission layer 151 is located above the third emission layer 153 (that is, between the second electrode 180 and the third emission layer 153) and the second emission layer 152 is located under the third emission layer 153 (that is, between the first electrode 120 and the third emission layer 153). Accordingly, since the first emission layer 151 and the second emission layer 152 do not overlap, the detachment of the edge may not occur. Accordingly, a defect-free and highly reliable organic light-emitting device may be manufactured.

The third emission layer 153 is formed as a common layer, and has the first region located in the first sub-pixel, the second region located in the second sub-pixel, and the third region located in the third sub-pixel. Accordingly, the first region of the third emission layer 153 is located between the first electrode 120 and the first emission layer 151 to allow holes injected from the first electrode 120 (in the case of an anode) to move toward the first emission layer 151, and the second region of the third emission layer 153 may allow electrons injected from the second electrode 180 (in the case of a cathode) to move toward the second emission layer 152. Also, the third region of the third emission layer 153 may emit the third color light. That is, in the first sub-pixel, the third emission layer 153 may not substantially emit the third color light, and in the second sub-pixel, the third emission layer 153 may not substantially emit the third color light.

Also, since the third emission layer 153, which is a common layer, emits the third color light, patterning of the emission layer for the emission of third color light in the third sub-pixel region is not required. Accordingly, misaligning of an emission layer for the emission of the third color light does not occur. The organic light-emitting device 100 having such a structure has a simple and inexpensive manufacturing process.

The third emission layer 153 may include a compound that has a hole transport function, an electron transport capability, and a third color light emission capability. For example, when the third color light is blue light, the third emission layer 153 may include a compound that has a hole transport capability, an electron transport capability, and a blue light emission capability.

The third emission layer 153 may include any known suitable emission materials. For example, the third emission layer 153 may include a known host and a known dopant.

Examples of a known host include tris-(8-hydroxyquinoline)aluminum (Alq$_3$), 4,4'-N,N'-dicarbazol-biphenyl (CBP), poly(n-vinylcarbazole) (PVK), 9,10-di(naphthalene-2-yl)anthracene (ADN), 4,4',4''-tris(N-carbazolyl)-triphenylamine (TCTA), 1,3,5-tris(N-phenylbenzimidazole-2-yl)benzene (TPBI), 3-tert-butyl-9,10-di(naphth-2-yl)anthracene (TBADN), E3, and distyrylarylene (DSA), but are not limited thereto.

TBADN

ADN

CBP

The dopant may be at least one of a fluorescent dopant and a phosphorescent dopant. The phosphorescent dopant may be an organic metallic complex including Ir, Pt, Os, Re, Ti, Zr, Hf, or a combination of at least two of these, but is not limited thereto.

When the third color light is blue, examples of a known blue dopant include bis[2-(4,6-difluorophenyl)pyridinato-N, C2'] irridium picolinate ($F_2$Irpic), ($F_2$ppy)$_2$Ir(tmd), Ir(dfppz)$_3$, ter-fluorene, 4,4'-bis(4-diphenylaminostyryl)biphenyl (DPAVBi), 2,5,8,11-tetra-tert-butyl perylene (TBPe), and DPVBi, but are not limited thereto.

F$_2$Irpic    (F$_2$ppy)$_2$Ir(tmd)    Ir(dfppz)$_3$

DPAVBi

TBPe

DPVBi

When the third emission layer 153 includes a host and a dopant, an amount of the dopant may be in a range of about 0.01 to about 15 wt % based on 100 wt % of the host, but the amount of the dopant is not limited thereto.

A thickness of the third emission layer 153 may be in a range of about 100 Å to about 500 Å, for example, about 150 Å to about 300 Å. In one embodiment, when the thickness of the third emission layer 153 is within the range described above, an organic light-emitting device does not have a substantial increase in driving voltage.

The first emission layer 151 and the second emission layer 152 may include any suitable emission materials. For example, the first emission layer 151 and the second emission layer 152 may include a suitable host and a suitable dopant.

Examples of a suitable host include tris-(8-hydroxyquinoline)aluminum (Alq$_3$), 4,4'-N,N'-dicarbazol-biphenyl (CBP), poly(n-vinylcarbazole) (PVK), 9,10-di(naphthalene-2-yl)anthracene (ADN), 4,4',4''-tris(N-carbazolyl)-triphenylamine (TCTA), 1,3,5-tris(N-phenylbenzimidazole-2-yl)benzene (TPBI), 3-tert-butyl-9,10-di(naphth-2-yl)anthracene (TBADN), E3, and distyrylarylene (DSA), but are not limited thereto.

TBADN

ADN

TPBI

E3

CBP

The dopant may be at least one of a fluorescent dopant and a phosphorescent dopant. The phosphorescent dopant may be an organic metallic complex including Ir, Pt, Os, Re, Ti, Zr, Hf, or a combination of at least two of these, but is not limited thereto.

When the first color light is red light, examples of a suitable red dopant include PtOEP, Ir(piq)$_3$, and BtpIr, but are not limited thereto.

BtpIr

PtOEP

Ir(piq)₃

When the second color light is green light, examples of a suitable green dopant include Ir(ppy)₃ (ppy indicates phenylpyridine), Ir(ppy)₂(acac), and Ir(mpyp)₃, but are not limited thereto.

Ir(ppy)₃

Ir(ppy)₂(acac)    Ir(myp)₃

When at least one of the first emission layer 151 and the second emission layer 152 includes a host and a dopant, an amount of the dopant may be in a range of about 0.01 to about 15 wt % based on 100 wt % of the host, but the amount of the dopant is not limited thereto.

Thicknesses of the first emission layer 151 and the second emission layer 152 may each be independently in a range of about 100 Å to about 1000 Å (for example, about 200 Å to about 600 Å). In one embodiment, when thicknesses of the first emission layer 151 and the second emission layer 152 are within the range described above, an organic light-emitting device has excellent emission characteristics without a substantial increase in driving voltage.

Also, the first auxiliary layer 191 and the second auxiliary layer 192 may compensate for an optical resonance distance according to a wavelength of light emitted from the emission layer, the emission efficiency of a formed organic light-emitting device may be improved. The first auxiliary layer 191 and the second auxiliary layer 192 may include at least one of suitable hole injection materials and suitable hole transport materials. The first auxiliary layer 191 and the second auxiliary layer 192 may each include a material that is identical to one of the materials included in the hole injection layer 140 and the hole transport layer located under the first auxiliary layer 191 and the second auxiliary layer 192. A material for the first auxiliary layer 191 and a material for the second auxiliary layer 192 may be identical to or different from each other.

The first auxiliary layer 191 and the second auxiliary layer 192 may include, for example, a carbazole derivative, such as N-phenylcarbazole or polyvinylcarbazol, N,N'-bis(3-methylphenyl)-N,N'-diphenyl-[1,1-biphenyl]-4,4'-diamine (TPD), 4,4',4''-tris(N-carbazolyl)triphenylamine (TCTA), or N,N'-di(1-naphthyl)-N,N'-diphenylbenzidine (NPB), but the materials for the first auxiliary layer 191 and the second auxiliary layer 192 are not limited thereto.

The first auxiliary layer 191 and the second auxiliary layer 192 may further include, in addition to the materials described above, a charge-generation material. Non-limiting examples of the charge-generation material may be understood by referring to those materials described in connection with the hole injection layer 140.

When the first auxiliary layer 191 and the second auxiliary layer 192 each further include a charge-generation material, the charge-generating material may be homogeneously dispersed or non-homogeneously distributed in the first auxiliary layer 191 and the second auxiliary layer 192.

The first auxiliary layer 191 and the second auxiliary layer 192 may each have a single-layer structure or a multi-layer structure including two or more layers. When the first auxiliary layer 191 has a multi-layer structure including two or more layers, materials for the layers may be different from or identical to each other. When the second auxiliary layer 192 has a multi-layer structure including two or more layers, materials for the layers may be different from or identical to each other.

Thicknesses of the first auxiliary layer 191 and the second auxiliary layer 192 may be each independently in a range of about 0.1 to about 30 nm. In one embodiment, when the thicknesses of the first auxiliary layer 191 and the second auxiliary layer 192 are within this range, without a substantial increase in driving voltage, the efficiency of an organic light-emitting device is improved due to the compensation for an optical resonance distance according to the wavelength of light emitted from the emission layer.

In the case that the first emission layer 151 and the second emission layer 152 each include a phosphorescent dopant, when the first emission layer 151 and the second emission layer 152 are used together, a triplet exciton or a hole may diffuse into the electron transport layer 160. To prevent this, before the electron transport layer 160 is formed, a hole blocking layer (HBL) may be formed by using various suitable methods, such as vacuum deposition, spin coating, casting, or LB. When the HBL is formed by vacuum deposition or spin coating, the deposition or coating conditions may be similar to those applied to form the hole injection layer 140, although the deposition or coating conditions may vary according to the material that is used to form the HBL. A hole blocking material may be any one of known suitable hole blocking materials, and examples thereof include an oxadiazole derivative, a triazole derivative, a phenanthroline derivative, Balq, etc.

BAlq

A thickness of the HBL may be in a range of about 10 Å to about 1,000 Å, for example, about 30 Å to about 300 Å. In one embodiment, when the thickness of the HBL is within these ranges, the HBL has satisfactory hole blocking ability without a substantial increase in driving voltage.

Then, the electron transport layer 160 is formed in all of the first sub-pixel, the second sub-pixel, and the third sub-pixel by using various suitable methods, such as vacuum deposition, spin coating, or casting. When the electron transport layer 160 is formed by vacuum deposition or spin coating, the deposition or coating conditions may be similar to those applied to form the hole injection layer 140, although the deposition or coating conditions may vary according to the material that is used to form the electron transport layer 160. For use as a material for forming the electron transport layer 160, a known suitable electron transportation material that stably transports electrons provided from the second electrode 180 may be used. Examples of such a material include a quinoline derivative, such as tris(8-quinolinolate)aluminum ($Alq_3$), 3-(biphenyl-4-yl)-5-(4-tert-butylphenyl)-4-phenyl-4H-1,2,4-triazole (TAZ), aluminum (III) bis(2-methyl-8-hydroxyquinoline)-4-phenyl-phenolate (Balq), berylium bis(benzoquinoli-10-noate) ($Bebq_2$), 9,10-di(naphthalene-2-yl)anthracene (AND), Compound 101, Compound 102, and 4,7-diphenyl-1,10-phenanthroline (BPhen), but are not limited thereto.

TAZ $Alq_3$

Compound 101

Compound 102

A thickness of the electron transport layer 160 may be in a range of about 100 Å to about 1000 Å, for example, about 150 Å to about 500 Å. In one embodiment, when the thickness of the electron transport layer 160 is within the range described above, the electron transport layer 160 has satisfactory electron transportation characteristics without a substantial increase in driving voltage.

Also, the electron transport layer 160 may include an electron transport organic compound and a metal-containing material. The metal-containing material may include a Li complex. Non-limiting examples of the Li complex include lithium quinolate (LiQ) and Compound 103 illustrated below:

Compound 103

An electron injection layer (EIL) 170, which facilitates injection of electrons from the second electrode 180, may be formed on the electron transport layer 160. Any suitable electron-injecting material may be used to form the EIL 170.

Non-limiting examples of materials for forming the EIL 170 include LiF, NaCl, CsF, $Li_2O$, and BaO, which are known in the art. The deposition conditions of the EIL 170 may be similar to those used to form the hole injection layer 140, although the deposition conditions may vary according to the material that is used to form the EIL 170.

A thickness of the EIL 170 may be in a range of about 1 Å to about 100 Å, for example, about 3 Å to about 90 Å. In one embodiment, when the thickness of the EIL 170 is within the range described above, the EIL 170 has satisfactory electron injection characteristics without a substantial increase in driving voltage.

The second electrode 180 may be formed as a common layer on the EIL 170. The second electrode 180 may be a cathode which is an electron injection electrode, and in this regard, a material for the second electrode 180 may be a metal, an alloy, an electrically conductive compound, or a combination thereof, which has a relatively low work capability. For example, lithium (Li), magnesium (Mg), aluminum (Al), aluminum-lithium (Al—Li), calcium (Ca), magnesium-indium (Mg—In), or magnesium-silver (Mg—Ag) may be formed as a thin film (having a thickness of, for example, about 10 Å to about 500 Å) to produce a semi-transparent electrode. To manufacture a top emission light-emitting device, a transmissive electrode formed using ITO or IZO may be used as the second electrode 180.

Hereinbefore, the organic light-emitting device 100 according to an embodiment of the present invention has been described in connection with FIG. 1.

The organic light-emitting device 100 may be manufactured by using a method of manufacturing an organic light-emitting device, wherein the method includes forming a first electrode 120 in each of the first sub-pixel region, the second sub-pixel region, and the third sub-pixel region of the substrate; forming the second emission layer 152 for emitting the second color light in the second sub-pixel region; forming the third emission layer 153 for emitting the third color light in all of the first sub-pixel region, the second sub-pixel region, and the third sub-pixel region; forming the first emission layer 151 for emitting the first color light in the first sub-pixel region; and forming the second electrode 180, wherein the first color light is red, the second color light is green, and the third color light is blue.

The method may further include forming the second auxiliary layer 192 in the second sub-pixel region between the second emission layer 152 and the first electrode 120. However, the method is not limited thereto. The forming of the second auxiliary layer 192 may be formed after the first electrode 120 is formed. However, this forming sequence is not limited thereto. Also, the second emission layer 152 and the second auxiliary layer 192 may be concurrently (e.g., simultaneously) formed by thermal transferring. However, the forming method of the second emission layer 152 and the second auxiliary layer 192 is not limited thereto.

The third emission layer 153 may be formed by vacuum deposition, but the forming method thereof is not limited thereto. The method may further include forming the first auxiliary layer 191 in the first sub-pixel region between the first region of the third emission layer 153 and the first emission layer 151, but is not limited thereto.

The first auxiliary layer 191 may be formed after the third emission layer 153 is formed. However, this forming sequence is not limited thereto. Also, the first emission layer 151 and the first auxiliary layer 191 may be concurrently (e.g., simultaneously) formed by thermal transferring. However, the forming method of the first emission layer 151 and the first auxiliary layer 191 is not limited thereto.

Figure 2:
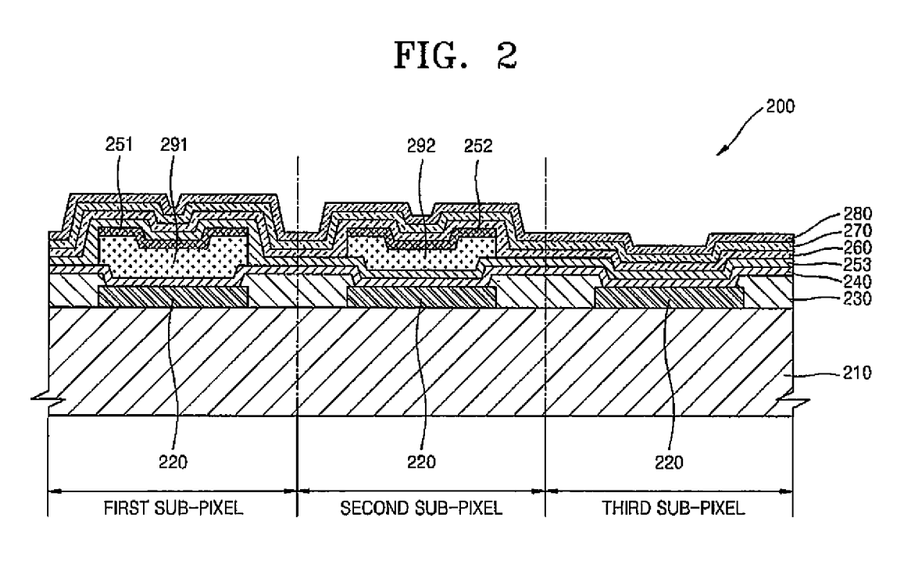
FIG. 2 is a schematic view of the structure of an organic light-emitting device according to another embodiment of the present invention.

FIG. 2 is a schematic cross-sectional view of an organic light-emitting device 200 according to an embodiment of the present invention. Hereinafter, the structure of an organic light-emitting device according to an embodiment of the present invention and a method of manufacturing an organic light-emitting device according to an embodiment of the present invention will be described in connection with FIG. 2.

The organic light-emitting device 200 of FIG. 2 includes a substrate 210 with a first sub-pixel, a second sub-pixel, and a third sub-pixel. A first electrode 220 is patterned in each of the first sub-pixel, the second sub-pixel, and the third sub-pixel. A hole injection layer 240 is formed as a common layer on the first electrodes 220 in all of the first sub-pixel, the second sub-pixel, and the third sub-pixel. An emission layer is formed on the hole injection layer 240.

The emission layer includes a first emission layer 251 that is formed in the first sub-pixel and emits a first color light, a second emission layer 252 that is formed in the second sub-pixel and emits a second color light, and a third emission layer 253 that is formed as a common layer in all of the first sub-pixel, the second sub-pixel, and the third sub-pixel and emits a third color light. The third emission layer 253 has a first region located in the first sub-pixel, a second region located in the second sub-pixel, and a third region located in the third sub-pixel. The first region of the third emission layer 253 is located between the first emission layer 251 and a second electrode 280, and the second region of the third emission layer 253 is located between the second emission layer 252 and the first electrode 220. Also, a first auxiliary layer 291 is located between the first emission layer 251 and the first electrode 220, and a second auxiliary layer 292 is located between the second region of the third emission layer 253 and the second emission layer 252. The first color light may be red fight, the second color light may be green light, and the third color light may be blue light.

An electron transport layer 260, an electron injection layer 270, and the second electrode 280 are each sequentially disposed in this stated order on the resultant structure, as a common layer in all of the first sub-pixel, the second sub-pixel, and the third sub-pixel.

The substrate 210, the first electrode 220, the hole injection layer 240, the first auxiliary layer 291, the first emission layer 251, the second auxiliary layer 292, the second emission layer 252, the third emission layer 253, the electron transport layer 260, the electron injection layer 270, and the second electrode 280 of the organic light-emitting device 200 should be apparent by referring to the corresponding detailed description made in connection with FIG. 1.

The first auxiliary layer 291 is formed on the hole injection layer 240, and the first emission layer 251 is formed on the first auxiliary layer 291. The first auxiliary layer 291 may be selectively used. When the first auxiliary layer 291 is used, the hole injection layer 240 and the first auxiliary layer 291 may contact each other. When the first auxiliary layer 291 is not used, the hole injection layer 240 and the first emission layer 251 may contact each other.

The third emission layer 253 may be formed as a common layer on the first emission layer 251 and the first electrode 220.

The second auxiliary layer 292 is formed on the third emission layer 253, and the second emission layer 252 is formed on the second auxiliary layer 292. The second auxiliary layer 292 may be selectively used. When the second auxiliary layer 292 is used, the third emission layer 253 and the second auxiliary layer 292 may contact each other. When the second auxiliary layer 292 is not used, the third emission layer 253 and the second emission layer 252 may contact each other.

The second emission layer 252 may be formed on the third emission layer 253 by using various suitable methods, such as vacuum deposition, spin coating, casting, LB, ink-jet printing, laser printing, or thermal transferring. For example, the second emission layer 252 may be formed by thermal transferring.

When the first emission layer 251 is formed by thermal transferring, the third emission layer 253 is formed by deposition, and the second emission layer 252 is formed by thermal transferring, edges of the first emission layer 251 and the second emission layer 252, which are formed by thermal transferring, may not overlap. That is, the first emission layer 251 and the second emission layer 252 may be spaced apart from each other with the third emission layer 253 located therebetween. Accordingly, since the first emission layer 251 and the second emission layer 252 do not overlap, the detachment of an edge may not occur. Accordingly, a defect-free and highly reliable organic light-emitting device may be manufactured.

The third emission layer 253 is formed as a common layer, and has the first region located in the first sub-pixel, the second region located in the second sub-pixel, and the third region located in the third sub-pixel. Accordingly, the first region of the third emission layer 253 is located between the second electrode 280 and the first emission layer 251 to allow electrons provided from the second electrode 280 (in the case of a cathode) to move toward the first emission layer 251, and the second region of the third emission layer 253 may allow holes provided from the first electrode 220 (in the case of an anode) to the second emission layer 252. Also, the third region of the third emission layer 253 may emit the third color light. That is, in the first sub-pixel, the third emission layer 253 may not substantially emit the third color light, and in the second sub-pixel, the third emission layer 253 may not substantially emit the third color light.

Also, since the third emission layer 253, which is a common layer, emits the third color light, patterning of an emission layer for the emission of the third color light in the third sub-pixel region is not required. Accordingly, misaligning of an emission layer for the emission of the third color light does not occur. The organic light-emitting device 200 having such a structure has a simple and inexpensive manufacturing process.

Hereinbefore, the organic light-emitting device 200 according to an embodiment of the present invention has been described in connection with FIG. 2.

The organic light-emitting device 200 may be manufactured by using a method of manufacturing an organic light-emitting device, wherein the method includes forming the first electrode 220 in each of the first sub-pixel region, the second sub-pixel region, and the third sub-pixel region of the substrate; forming the first emission layer 251 for emitting the first color light in the first sub-pixel region; forming the third emission layer 253 for emitting the third color light in all of the first sub-pixel region, the second sub-pixel region, and the third sub-pixel region; forming the second emission layer 252 for emitting the second color light in the second sub-pixel region; and forming the second electrode 280, wherein the first color light is red, the second color light is green, and the third color light is blue.

The method may further include forming the first auxiliary layer 291 between the first emission layer 251 and the first electrode 220 in the first sub-pixel region. However, the method is not limited thereto. The forming of the first auxiliary layer 291 may be formed after the first electrode 220 is formed. However, this forming sequence is not limited thereto. Also, the first emission layer 251 and the first auxiliary layer 291 may be concurrently (e.g., simultaneously) formed by thermal transferring. However, the forming method of the first emission layer 151 and the first auxiliary layer 191 is not limited thereto.

The third emission layer 253 may be formed by vacuum deposition, but the forming method thereof is not limited thereto. The method may further include forming the second auxiliary layer 192 between the second region of the third emission layer 253 and the second emission layer 252 in the second sub-pixel region, but is not limited thereto.

The second auxiliary layer 292 may be formed after the third emission layer 253 is formed. However, this forming sequence is not limited thereto. Also, the first emission layer 251 and the second auxiliary layer 292 may be concurrently (e.g., simultaneously) formed by thermal transferring. However, the forming method of the first emission layer 251 and the second auxiliary layer 292 is not limited thereto.

The organic light-emitting device according to an embodiment of the present invention may be included in a flat panel display device including a thin film transistor. The thin film transistor may include a gate electrode, source and drain electrodes, a gate insulating film, and an active layer, and one of the source and drain electrodes may electrically contact a first electrode of the organic light-emitting device.

As described above, organic light-emitting devices according to embodiments of the present invention have high reliability and can be manufactured using a simple and inexpensive manufacturing process.

It should be understood that the example embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and equivalents thereof.

What is claimed is:

1. An organic light-emitting device comprising:
    a substrate with a first sub-pixel, a second sub-pixel, and a third sub-pixel;
    a first electrode in each of the first sub-pixel, the second sub-pixel, and the third sub-pixel;
    a second electrode facing the first electrode; and
    an emission layer between the first electrode and the second electrode;
    wherein the emission layer comprises a first emission layer in the first sub-pixel and configured to emit a first color light, a second emission layer in the second sub-pixel and configured to emit a second color light, and a third emission layer in all of the first sub-pixel, the second sub-pixel, and the third sub-pixel, and configured to emit a third color light,
    the third emission layer has a first region located in the first sub-pixel, a second region located in the second sub-pixel, and a third region located in the third sub-pixel,
    the first color light is red, the second color light is green, and the third color light is blue, and
    i) the first region of the third emission layer is between the first emission layer and the first electrode, and the second region of the third emission layer is between the second emission layer and the second electrode, and the organic light-emitting device further comprises a first auxiliary layer between the first region of the third emission layer and the first emission layer in the first sub-pixel; or
    ii) the first region of the third emission layer is between the first emission layer and the second electrode, and the second region of the third emission layer is between the second emission layer and the first electrode, and the organic light-emitting device further comprises a second auxiliary layer between the second region of the third emission layer and the second emission layer in the second sub-pixel.

2. The organic light-emitting device of claim 1,
    wherein the first region of the third emission layer is between the first emission layer and the first electrode, and the second region of the third emission layer is between the second emission layer and the second electrode, and
    the organic light-emitting device further comprises the first auxiliary layer between the first region of the third emission layer and the first emission layer in the first sub-pixel, and
    the second auxiliary layer between the second emission layer and the first electrode in the second sub-pixel.

3. The organic light-emitting device of claim 1,
    wherein the first region of the third emission layer is between the first emission layer and the second electrode, and the second region of the third emission layer is between the second emission layer and the first electrode, and
    the organic light-emitting device further comprises the second auxiliary layer between the second region of the third emission layer and the second emission layer in the second sub-pixel, and
    the first auxiliary layer between the first emission layer and the first electrode in the first sub-pixel.

4. The organic light-emitting device of claim 1, further comprising:
    a hole transport region between the first electrode and the emission layer and comprising at least one selected from a hole injection layer, a hole transport layer, a single layer having a hole injection capability and a hole transport capability, and an electron blocking layer; and
    an electron transport region between the emission layer and the second electrode and comprising at least one selected from a hole blocking layer, an electron transport layer, and an electron injection layer.

* * * * *